United States Patent
Tanaka et al.

(10) Patent No.: US 11,923,218 B2
(45) Date of Patent: Mar. 5, 2024

(54) DEVELOPMENT PROCESSING APPARATUS AND DEVELOPMENT PROCESSING METHOD

(71) Applicant: Tokyo Electron Limited, Tokyo (JP)

(72) Inventors: Kouichirou Tanaka, Kumamoto (JP); Masahiro Fukuda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 587 days.

(21) Appl. No.: 17/177,270

(22) Filed: Feb. 17, 2021

(65) Prior Publication Data

US 2021/0272826 A1 Sep. 2, 2021

(30) Foreign Application Priority Data

Feb. 27, 2020 (JP) ................................ 2020-031413

(51) Int. Cl.
| | | |
|---|---|---|
| H01L 21/67 | (2006.01) | |
| H01L 21/027 | (2006.01) | |
| H01L 21/673 | (2006.01) | |
| H01L 21/687 | (2006.01) | |

(52) U.S. Cl.
CPC .... *H01L 21/67225* (2013.01); *H01L 21/0273* (2013.01); *H01L 21/67023* (2013.01); *H01L 21/6715* (2013.01); *H01L 21/67313* (2013.01); *H01L 21/68764* (2013.01)

(58) Field of Classification Search
CPC .......... H01L 21/67225; H01L 21/0273; H01L 21/67023; H01L 21/67313; H01L 21/68764
See application file for complete search history.

(56) References Cited

U.S. PATENT DOCUMENTS 8,678,684 B2 * 3/2014 Yamamoto ........ H01L 21/67051
396/611

FOREIGN PATENT DOCUMENTS

JP 2016-081964 A 5/2016

\* cited by examiner

*Primary Examiner* — Minh Q Phan
(74) *Attorney, Agent, or Firm* — Venjuris, P.C.

(57) ABSTRACT

A development processing apparatus includes: a substrate holder that holds a substrate horizontally wherein the substrate includes a resist film; a rotator that rotates the substrate holder; first and second developer supplies that supply a developer to the substrate; and a liquid receiver that receives the developer from the substrate. The first developer supply is formed to have a length smaller than a diameter of the substrate. The second developer supply is formed to have a length equal to or larger than the diameter of the substrate. The liquid receiver includes first and second annular walls that are formed in an annular shape having a circular opening having a diameter larger than the diameter of the substrate. The first and second annular walls are movable up and down independently of each other, and a vertical distance between the first annular wall and the second annular wall is variable.

9 Claims, 6 Drawing Sheets

FIG. 7I

DEVELOPMENT PROCESSING APPARATUS AND DEVELOPMENT PROCESSING METHOD

CROSS-REFERENCE TO RELATED APPLICATION

This application is based on and claims priority from Japanese Patent Application No. 2020-031413 filed on Feb. 27, 2020 with the Japan Patent Office, the disclosure of which is incorporated herein in its entirety by reference.

TECHNICAL FIELD

The present disclosure relates to a development processing apparatus and a development processing method.

BACKGROUND

Japanese Patent Laid-Open Publication No. 2016-081964 describes a development processing apparatus that includes a substrate holder that holds a substrate formed with an exposed resist film on the surface thereof horizontally, and a developer supply that supplies a developer to the surface of the substrate. The development processing apparatus disclosed in Japanese Patent Laid-Open Publication No. 2016-081964 includes a developer supply nozzle provided with an ejection port for supplying the developer downward and served as a developer supply. The ejection port of the developer supply nozzle is provided along the longitudinal direction of the nozzle, and is formed in a slit shape having substantially the same length as the diameter of the wafer W.

SUMMARY

According to an embodiment of the present disclosure, a development processing apparatus develops a resist film on a substrate. The development processing apparatus includes: a substrate holder configured to hold the substrate horizontally; a rotation mechanism configured to rotate the substrate holder around a vertical axis; first and second developer supplies configured to supply a developer to the substrate held by the substrate holder; and a liquid receiver configured to receive the developer from the substrate held by the substrate holder. The first developer supply has a length smaller than a diameter of the substrate in a plan view. The second developer supply has a length equal to or larger than the diameter of the substrate in a plan view. The liquid receiver includes first and second annular walls that are formed in an annular shape having a circular opening having a diameter larger than the diameter of the substrate in a plan view. The second annular wall is provided above the first annular wall. The first and second annular walls are configured to be movable up and down independently of each other, and a vertical distance between the first annular wall and the second annular wall is variable.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawing, and claims are not meant to be limiting. Other embodiments may be utilized, and other changes may be made without departing from the spirit or scope of the subject matter presented here.

In the photolithography process in the manufacturing process of a semiconductor device, various processes are performed in order to form a desired resist pattern on a substrate such as a semiconductor wafer (hereinafter, referred to as a "wafer"). The various processes include, for example, a resist coating process of supplying a resist liquid onto a substrate to form a resist film, an exposure process of exposing the resist film, and a developing process of supplying a developer to the exposed resist film for development.

The above-mentioned developing process is performed using a development processing apparatus. The development processing apparatus includes a substrate holder that holds the substrate and a developer supply that supplies the developer to the substrate held by the substrate holder, and supplies the developer from the developer supply onto the substrate held by the substrate holder, forms a liquid film of the developer on the surface of the substrate, and develops the resist film on the substrate. Further, the development processing apparatus includes a liquid receiver that receives the developer scattered from the substrate held by the substrate holder. The liquid receiver has an annular wall that is formed in an annular shape having a circular opening having a diameter larger than that of the substrate. As a result, for example, the substrate is transferred between a substrate transfer mechanism inserted into the development processing apparatus and the substrate holder from the outside of the development processing apparatus through the opening of the annular wall, but the annular wall may prevent the developer that has been shaken off from the substrate held by the substrate holder or bounced off by the substrate from being ejected to the outside of the liquid receiver.

There are various types of developer supplies. For example, Japanese Patent Laid-Open Publication No. 2016-081964 discloses a developer supply in which an ejection port is formed in a slit shape having a length substantially the same as the diameter of the substrate. As described above, there are a relatively long developer supply and a relatively short developer supply.

However, in the related art, the relatively long developer supply and the relatively short developer supply cannot share a liquid receiver. The reason is as follows.

Figure 1:
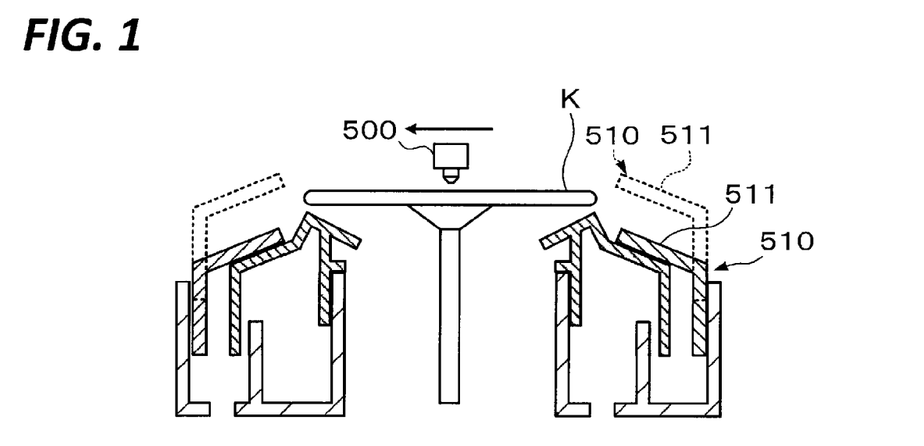
FIG. 1 is an explanatory diagram of a development processing apparatus of the related art.
Figure 2:
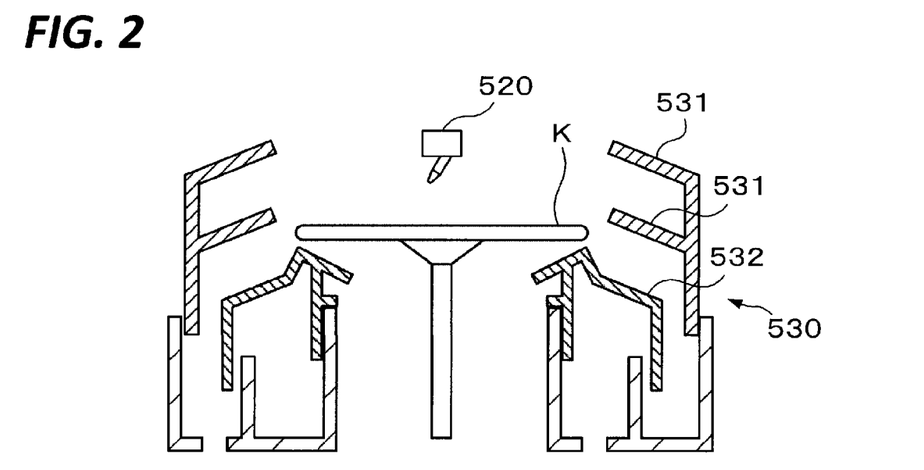
FIG. 2 is an explanatory diagram of a development processing apparatus of the related art.

For example, in the related art, as illustrated in FIG. 1, in a development processing apparatus in which the developer supply 500 is relatively long, the annular wall 511 of the liquid receiver 510 is provided in a single stage. In contrast, as illustrated in FIG. 2, in a development processing apparatus in which the developer supply 520 is relatively short, the annular wall 531 of the liquid receiver 530 may be provided in multiple stages in the vertical direction and integrally with each other. Further, in the related art, in a development processing apparatus having a relatively long developer supply, when supplying the developer from the developer supply, it may be necessary to lower the annular wall so as not to interfere with the developer supply. For example, as illustrated in FIG. 1, when the relatively long developer supply 500 is brought close to the substrate K and scanned along the substrate K, it is necessary to lower the annular wall 511 so as not to interfere with the developer supply 500, as described above.

Figure 3A:
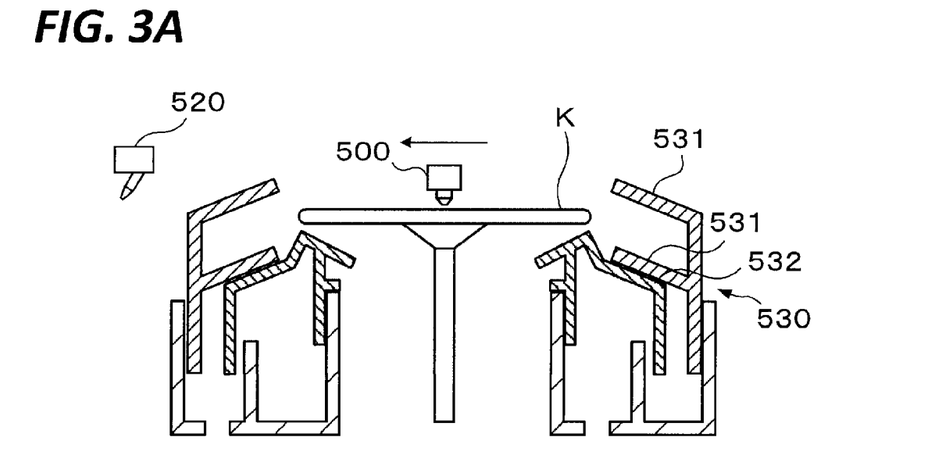
FIGS. 3A and 3B are diagrams for explaining the technical task according to the present disclosure.
Figure 3B:
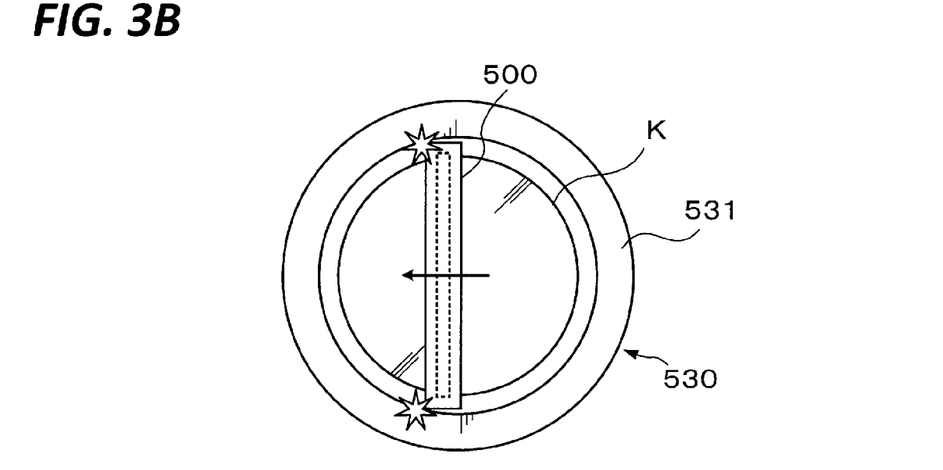

However, when the development processing apparatus is provided with both a relatively long developer supply and a relatively short developer supply, and the annular wall is provided in multiple stages and integrally for the relatively short developer supply as described above, the following problems may occur. That is, when the developer is supplied from the relatively long developer supply, even when the multi-stage annular wall 531 is lowered as illustrated in FIG. 3A, the relatively long developer supply 500 and the upper annular wall 531 may interfere with each other, as illustrated in FIG. 3B. Therefore, in the related art, the relatively long developer supply and the relatively short developer supply cannot share the liquid receiver.

Therefore, the technique according to the present disclosure provides a development processing apparatus and a development processing method in which the liquid receiver may be shared to receive a developer that is scattered from a substrate by a relatively long first developer supply and a relatively short second developer supply formed in a length equal to or larger than the diameter of the substrate in a plan view.

The outer peripheral portion of an inner cup 532 provided in the inner portion of the liquid receiver 530 limits the lowering of the annular wall 531 of the liquid receiver 530. When the height of the outer peripheral portion of the inner cup 532 is changed, it affects the airflow around the substrate K, so that it is not easy to change.

Hereinafter, the configurations of the development processing apparatus and the development processing method according to the present embodiment will be described with reference to the drawings. Also, in the present specification, elements having substantially the same functional configuration are designated by the same reference numerals, so that duplicate descriptions thereof will be omitted.

Figure 4:
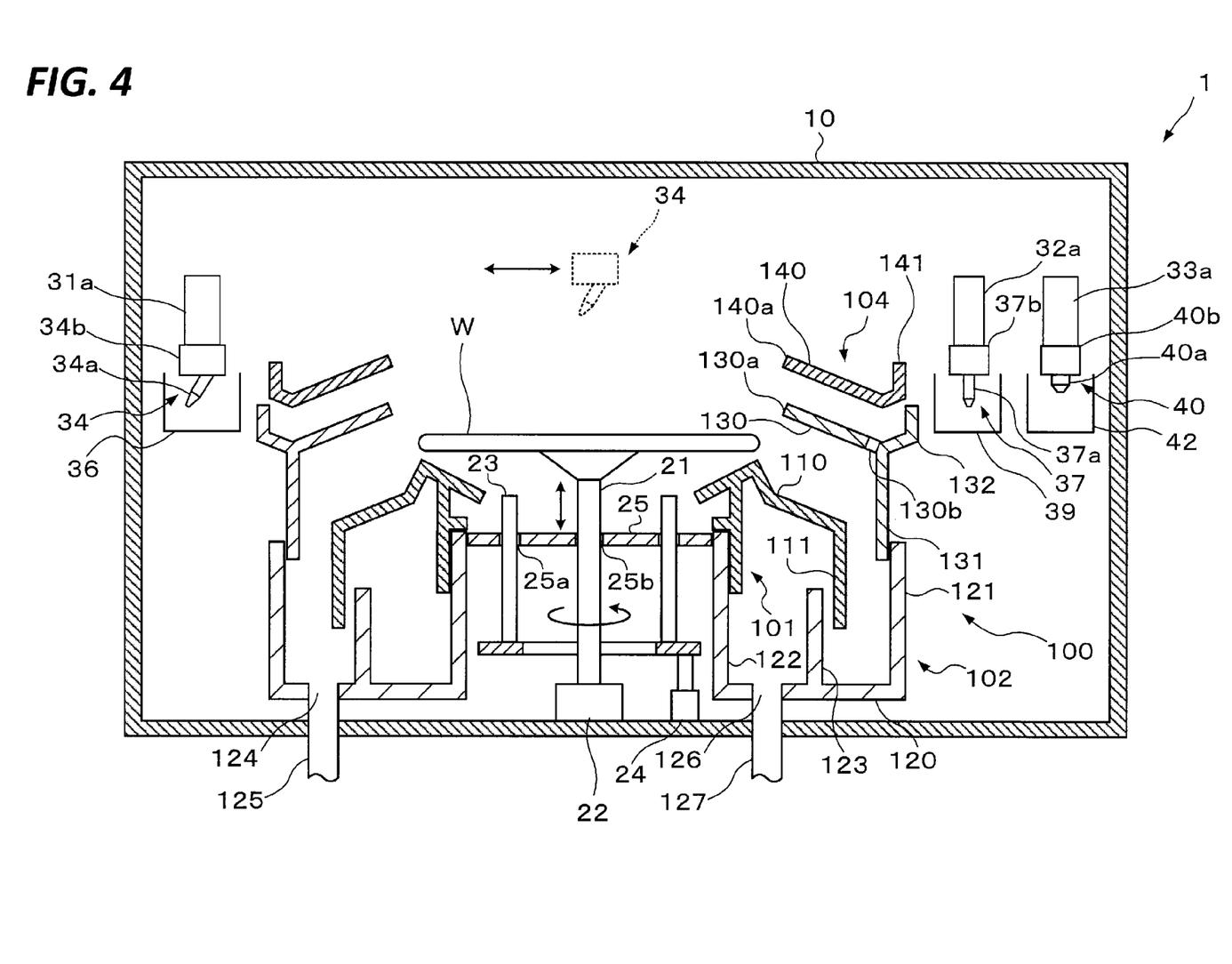
FIG. 4 is a vertical cross-sectional view schematically illustrating an outline of the configuration of the development processing apparatus according to the present embodiment.
Figure 5:
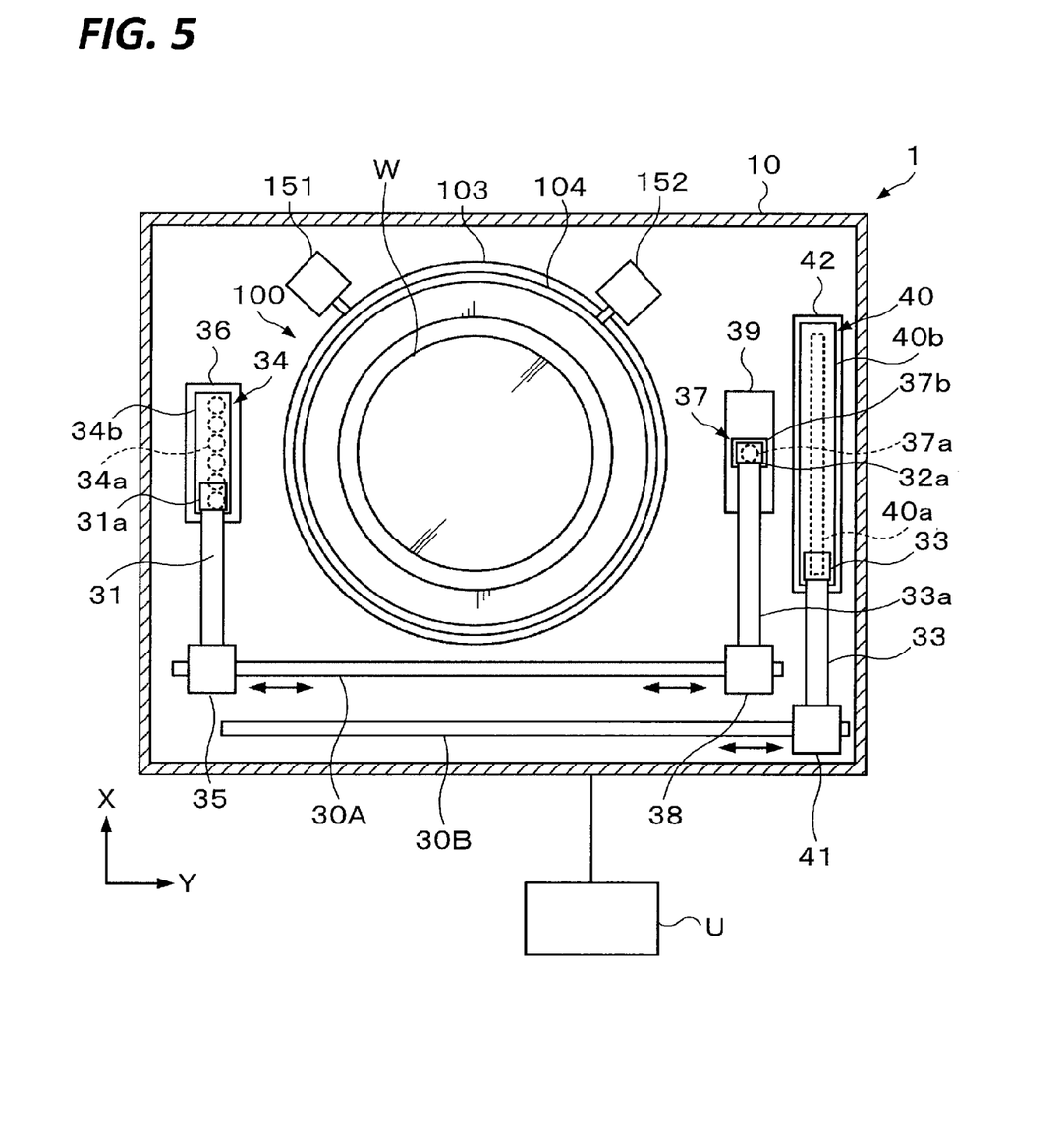
FIG. 5 is a cross-sectional view schematically illustrating an outline of a configuration of the development processing apparatus according to the present embodiment.

FIGS. 4 and 5 are a vertical cross-sectional view and a horizontal cross-sectional view, respectively, schematically illustrating an outline of a configuration of the development processing apparatus according to the present embodiment.

As illustrated in FIGS. 4 and 5, the development processing apparatus 1 includes a processing container 10 capable of sealing the inside thereof. A carry-in/carry-out port (not illustrated) for the wafer W as a substrate is formed on the side surface of the processing container 10.

A spin chuck 20 is provided in the processing container 10 as a substrate holder that horizontally holds and rotates the wafer W. The spin chuck 20 is connected to a chuck driver 22 as a rotation mechanism having, for example, a motor or a cylinder, via a shaft 21. The chuck driver 22 allows the spin chuck 20 to rotate around a vertical axis at a predetermined speed.

On the back surface of the wafer W held by the spin chuck 20, for example, a plurality (e.g., three) of elevating pins 23 are provided as elevating members for transferring the wafer W between the external wafer transfer mechanism of the development processing apparatus 1 and the spin chuck 20. The elevating pin 23 may be elevated and lowered by a pin driver 24 having a motor or a cylinder.

Further, a circular plate 25 is provided on the back surface of the wafer W held by the spin chuck 20 so as to surround the shaft 21. The circular plate 25 is formed with a hole 25a through which the shaft 21 is inserted and a hole 25b through which the elevating pin 23 is inserted.

Further, in the processing container 10, a cup body 100 as a liquid receiver is provided so as to surround the spin chuck 20 in a plan view. The cup body 100 receives the developer and the rinse liquid that have been shaken off, dropped, or bounced off from the wafer W held by the spin chuck 20, and guides the developer and the rinse liquid in order to eject the liquid to the outside of the development processing apparatus 1. Details of the cup body 100 will be described later.

As illustrated in FIG. 5, rails 30A and 30B extending along the Y direction (left and right direction in FIG. 2) are formed on the negative direction of the cup body 100 in the X direction (downward direction in FIG. 5). The rails 30A and 30B are formed, for example, from the outside of the cup body 100 on the negative direction in the Y direction (left direction in FIG. 2) to the outside on the positive direction in the Y direction (right direction in FIG. 2). The rail 30A is provided with two arms 31 and 32, and the rail 30B is provided with one arm 33.

A first developer supply 34 that supplies a developer to the wafer W held by the spin chuck 20 is supported on the first arm 31 via a support member 31a extending in the vertical direction. The first developer supply 34 includes a cylindrical developer ejection nozzle 34a having a developer ejection port on the lower surface, and a nozzle head 34b in which the developer ejection nozzle 34a is supported on the lower surface. The first developer supply 34 is provided with a plurality of developer ejection nozzles 34a, and specifically, the plurality of developer ejection nozzles 34a are arranged along one direction (i.e., the X direction, the vertical direction in FIG. 5).

The first developer supply 34 is formed to be shorter than the second developer supply 40, which will be described later, in a plan view, and the length of the first developer supply 34 in the longitudinal direction (specifically, the length of the nozzle head 34b in the arrangement direction of the developer ejection nozzles 34a) is smaller than the diameter of the wafer W.

The first arm 31 is movable freely on the rail 30A by a nozzle driver 35. As a result, the first developer supply 34 may move from the standby portion 36 provided outside the cup body 100 on the negative side in the Y direction of to the upper portion of the center of the wafer W in the cup body 100. Further, the nozzle driver 35 allows the first arm 31 to be freely elevated and lowered, and the height of the first developer supply 34 may be adjusted.

On the second arm 32, a rinse liquid supply 37 that supplies the rinse liquid onto the wafer W held by the spin chuck 20 is supported via a support member 32a extending in the vertical direction. The rinse liquid supply 37 includes a cylindrical rinse liquid ejection nozzle 37a having a rinse liquid ejection port on the lower surface, and a nozzle head 37b in which the rinse liquid ejection nozzle 37a is supported on the lower surface. The rinse liquid supply 37 is provided with one rinse liquid ejection nozzle 37a.

The second arm 32 is movable freely on the rail 30A by the nozzle driver 38. As a result, the rinse liquid supply 37 may move from the standby portion 39 provided outside the cup body 100 on the positive side in the Y direction to the upper portion of the center of the wafer W in the cup body 100. Further, the nozzle driver 38 allows the second arm 32 to be freely elevated and lowered, and the height of the rinse liquid supply 37 may be adjusted.

On the third arm 33, a second developer supply 40 that supplies the developer to the wafer W held by the spin chuck 20 is supported via a support member 33a extending in the vertical direction. The second developer supply 40 includes a square-shaped developer ejection nozzle 40a having a developer ejection port on the lower surface, and a nozzle head 40b in which the developer ejection nozzle 40a is supported on the lower surface. The second developer supply 40 is provided with one developer ejection nozzle 40a, the ejection port of the developer ejection nozzle 40a is formed in a rectangular shape in a plan view, and the length of the ejection port in the longitudinal direction is substantially the same as the diameter of the wafer W.

The second developer supply 40 is formed to be longer than the first developer supply 34 in a plan view, and the length of the second developer supply 34 in the longitudinal direction (specifically, the length of the nozzle head 34b along the longitudinal direction of the ejection port of the developer ejection nozzle 40a) is equal to or larger than the diameter of the wafer W.

Further, when supplying the developer, the distance from the ejection port of the nozzle to the surface of the wafer W on the spin chuck 20 is longer in the developer ejection nozzle 34a of the first developer supply 34 than in the developer ejection nozzle 40a of the second developer supply 40. The type of developer supplied by the second developer supply 40 is the same as that of the first developer supply 34.

The developer ejection nozzle 40a may be called a liquid contact nozzle. The liquid contact nozzle has an ejection port for ejecting a developer and a lower end surface extending laterally from the ejection port and substantially parallel to the surface of the wafer W.

The third arm 33 is movable freely on the rail 30B by a nozzle driver 41. As a result, the second developer supply 40 may move from the standby portion 42 provided the cup body 100 on the positive side in the Y direction to the upper portion of the center of the wafer W in the cup body 100. Further, the nozzle driver 41 allows the third arm 33 to be freely elevated and lowered, and the height of the second developer supply 40 may be adjusted.

The rinse liquid ejection nozzle 37a and the developer ejection nozzle 40a of the second developer supply 40 eject the rinse liquid and the developer downward in the vertical direction, that is, perpendicular to the horizontal plane. In contrast, the developer ejection nozzle 34a of the first developer supply 34 ejects the developer obliquely with respect to the surface of the wafer W which is a horizontal plane. Further, the developer ejection nozzle 34a is inclined so that the ejection port thereof faces the outside of the wafer W.

The cup body 100 includes an inner cup 101, an intermediate cup 102, an outer cup 103, and an upper cover 104.

The inner cup 101 is provided in an annular shape to surround the circular plate 25 in a plan view. The inner cup 101 includes a guide wall 110 that guides the developer spilled from the wafer W to the outside and downward, and a cylindrical vertical wall 111 that extends downward in the vertical direction from the outer peripheral end of the guide wall 110.

The intermediate cup 102 is provided below the inner cup 101. The inner cup 101 includes an annular bottom wall 120 located at the bottom and cylindrical vertical walls 121 to 123 extending vertically upward from the bottom wall 120. The vertical wall 121 extends vertically upward from the outer peripheral end of the bottom wall 120, and the vertical wall 122 extends vertically upward from the inner peripheral end of the bottom wall 120. The vertical wall 123 extends vertically upward from a position on the bottom wall 120 between the outer peripheral end and the inner peripheral end.

A drain port 124 for discharging the liquid received by the cup body 100 is formed between the vertical wall 122 and the vertical wall 123 in the bottom wall 120, and a drain pipe 125 is connected to the drain port 124. Further, an exhaust port 126 for exhausting the atmosphere around the wafer W is formed between the vertical wall 121 and the vertical wall 123 in the bottom wall 120, and an exhaust pipe 127 is connected to the exhaust port 126. The liquid discharged from the drain port 124 and the gas discharged from the exhaust port 126 may be separated by the vertical wall 123. The vertical wall 111 of the inner cup 101 is formed to be located outside the vertical wall 123 so that the liquid guided by the guide wall 110 is discharged from the drain port 124.

The outer cup 103 is provided to cover the outer peripheral portions of the inner cup 101 and the intermediate cup 102 in an annular shape from above. The outer cup 103 includes an annular wall 130 formed in an annular shape having a circular opening 130a slightly larger than the diameter of the wafer W in a plan view. The annular wall 130 is inclined to be gradually lowered toward the outer periphery. A through hole 130b that penetrates from the upper surface to the lower surface of the annular wall 130 is provided in the lower portion of the annular wall 130.

Further, the outer cup 103 includes a cylindrical vertical wall 131 extending vertically downward from the outer peripheral end of the annular wall 130, and a cylindrical outer peripheral wall 132 extending upward from the outer peripheral end of the annular wall 130. The vertical wall 131 is provided to be located between the vertical wall 122 and the vertical wall 123 of the intermediate cup 102. The gap between the annular wall 130 of the outer cup 103 and the guide wall 110 of the inner cup 101, the gap between the vertical wall 111 of the inner cup 101 and the vertical wall 131 of the outer cup 103, and the gap between the vertical wall 111 of the inner cup 101 and the vertical wall 122 of the intermediate cup 102 form exhaust paths for exhausting the atmosphere around the wafer W.

The upper cover 104 is provided above the outer cup 103 to be vertically connected to the outer cup 103. The upper cover 104 includes an annular wall 140 formed in an annular shape having a circular opening 140a slightly larger than the diameter of the wafer W in a plan view. The annular wall 140 is provided above the annular wall 130 of the outer cup 103 to be vertically connected to the annular wall 1. The diameter of the opening 140a of the annular wall 140 in a plan view is substantially the same as the opening 130a of the annular wall 130 of the outer cup 103. The annular wall 140 is inclined to be gradually lowered toward the outer periphery. Further, the upper cover 104 includes a cylindrical outer peripheral wall 141 extending upward from the outer peripheral end of the annular wall 140.

As illustrated in FIG. 5, the outer cup 103 and the upper cover 104 are connected to the elevating mechanisms 151 and 152 having a motor or the like, respectively. The outer cup 103 and the upper cover 104 may be elevated and lowered independently of each other by the elevating mechanisms 151 and 152. The outer cup 103 and the upper cover 104 may be elevated and lowered independently of each other by the elevating mechanisms 151 and 152. As a result, the distance between the annular wall 130 of the outer cup 103 and the annular wall 140 of the upper cover 104 is variable. The drive of the elevating mechanisms 151 and 152 is controlled by a controller U described later.

The development processing apparatus 1 described above is provided with a controller U as illustrated in FIG. 5. The controller U is, for example, a computer provided with a CPU, a memory, or the like, and has a program storage (not illustrated). The program storage stores a program that controls the processing of the wafer W in the development processing apparatus 1. Further, the program may be recorded on a storage medium readable by a computer, and may be installed on the controller U from the storage medium. A part or entirety of the program may be implemented by dedicated hardware (circuit board).

Next, the case where the wafer processing using the development processing apparatus 1 configured as described above is performed with the developer from the first developer supply 34 and the case where the wafer processing is performed with the developer from the second developer supply 40 will be described with reference to FIGS. 6A to 6I and 7A to 7I. FIGS. 6A to 6I are diagrams illustrating an internal state of the development processing apparatus 1 in each step of wafer processing when developing is performed with a developer from the first developer supply 34. FIGS. 7A to 7I are diagrams illustrating an internal state of the development processing apparatus 1 in each step of wafer processing when developing is performed with a developer from the second developer supply 40.

Further, in the following description, it is assumed that a resist film is formed on the surface of the wafer W before it is carried into the development processing apparatus 1, and the exposure treatment and the subsequent heat treatment of the resist film are completed.

[When Developing with the Developer from the First Developer Supply 34]

Figure 6A:
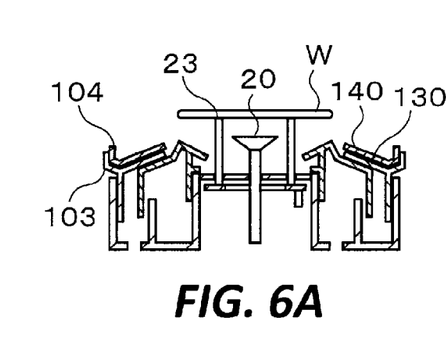
FIGS. 6A to 6I are diagrams illustrating an internal state of a development processing apparatus in each step of wafer processing when developing is performed with a developer from a first developer supply.

First, a wafer transfer mechanism (not illustrated) holding the wafer W is inserted into the processing container 10 from the outside of the processing container 10 through a carry-in/carry-out port (not illustrated) provided on the side surface of the processing container 10. Then, the wafer W is transferred above the spin chuck 20. Subsequently, the elevating pin 23 is raised by the drive of the pin driver 24, protrudes from the upper surface of the spin chuck 20 by a predetermined distance, and the wafer W is delivered to the elevating pin 23 as illustrated in FIG. 6A. Further, before the wafer W is delivered to the elevating pin 23, the outer cup 103 and the upper cover 104 are moved to the first cup position and the first cover position, respectively, by driving the elevating mechanisms 151 and 152. The first cup position is a position where the upper end of the annular wall 130 of the outer cup 103 is lower than the surface of the wafer W on the spin chuck 20. The first cover position is a position above the outer cup 103 where the upper end of the annular wall 140 of the upper cover 104 is lower than the surface of the wafer W on the spin chuck 20.

Figure 6B:
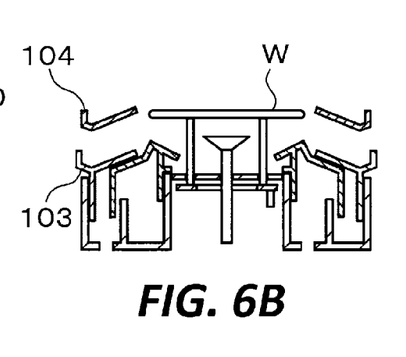

Next, by driving the elevating mechanism 152, as illustrated in FIG. 6B, the upper cover 104 is raised and moves to the second cover position described later.

Figure 6C:
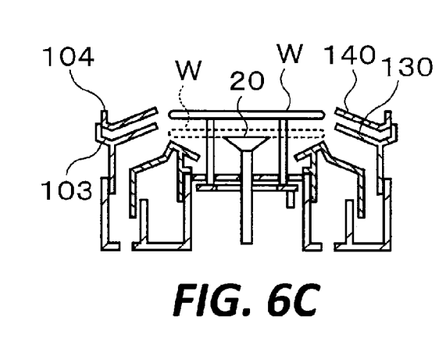

Subsequently, as illustrated in FIG. 6C, the outer cup 103 is raised and moves to the second cup position by driving the elevating mechanism 151.

The second cup position is a position where the lower surface of the inner peripheral end of the annular wall 130 of the outer cup 103 is higher than the surface of the wafer W on the spin chuck 20. In contrast, the second cover position is a position above the second cup position where the distance between the annular wall 140 of the upper cover 104 at the second cover position and the annular wall 130 of the outer cup 103 at the second cup position is longer than the distance between the annular wall 140 of the upper cover 104 at the first cover position and the annular wall 130 of the outer cup 103 at the first cup position.

Figure 6D:
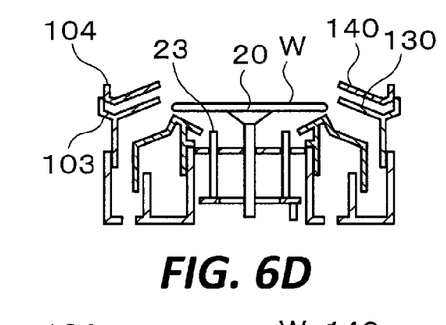

Subsequently, as illustrated in FIG. 6D, the elevating pin 23 is lowered by driving the pin driver 24, the wafer W is delivered to the upper surface of the spin chuck and the wafer W is attracted and held by the spin chuck 20.

Figure 6E:
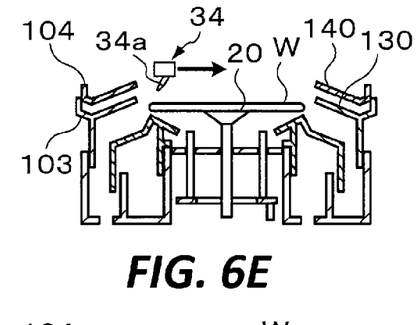

Next, by driving the nozzle driver 35, as illustrated in FIG. 6E, the first developer supply 34 moves above the wafer W, the developer is started to be supplied from the developer ejection nozzle 34a onto the wafer W, and a liquid film of the developer (hereinafter, may be referred to as a developer film) is formed. For example, when forming the developer film, the first developer supply 34 is controlled by the nozzle driver 35 so that the ejection destination of the developer from the first developer supply 34 moves from the peripheral edge portion of the wafer W to the center. Further, the spin chuck 20 is controlled by the chuck driver 22 so that the rotation speed of the wafer W decreases as the ejection destination of the developer from the first developer supply 34 approaches the center of the wafer W. The rotation speed of the wafer W is, for example, 700 rpm to 1500 rpm when the ejection destination of the developer from the first developer supply 34 is the peripheral portion of the wafer W, and 0 rpm when the ejection destination thereof is the center of the wafer W. When the ejection destination of the developer from the first developer supply 34 reaches the center of the wafer W and the developer film is formed, the supply of the developer from the developer ejection nozzle 34a and the rotation of the wafer W are stopped, and the first developer supply 34 is retracted from the wafer W by driving the nozzle driver 35.

When the developer is supplied from the first developer supply 34, the outer cup 103 is arranged at the second cup position. The effect of this configuration is as follows.

(A1) A desired airflow may be obtained around the side of the wafer W on the spin chuck 20.

(A2) The developer that is shaken off from the wafer W on the spin chuck 20 may be received by the annular wall 130 of the outer cup 103.

(A3) The mist of the developer generated by the supply of the developer may be sucked between the annular wall 130 and the inner cup 101.

Further, when the developer is supplied from the first developer supply 34, the upper cover 104 is arranged at the second cover position. The effect of this configuration is as follows.

(B1) The developer ejected from the wafer W rotating at a high rotation speed and bounced off from the wafer W may be received by the lower surface of the annular wall 140 of the upper cover 104.

Also, the annular wall 140 of the upper cover 104 does not receive the developer or the rinse liquid on its upper surface.

The developer received by the annular wall 140 of the upper cover 104 falls on the upper surface of the annular wall 130 of the outer cup 103, reaches the inside of the intermediate cup 102 through the through hole 130b, and is discharged from the cup body 100 through the drain port 124.

Figure 6F:
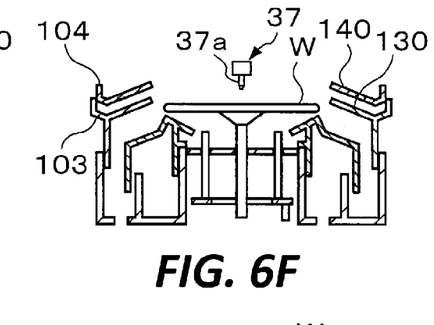

When a predetermined time elapses after the developer film is formed and the development of the resist film on the wafer W is completed, the rinse liquid supply 37 moves above the center of the wafer W by driving the nozzle driver 38 as illustrated in FIG. 6F, and the rinse liquid is supplied from the rinse liquid ejection nozzle 37a onto the wafer W to clean the wafer W. For example, at the time of this cleaning, by driving the chuck driver 22, the rinse liquid is supplied onto the wafer W from the rinse liquid ejection nozzle 37a to the wafer W rotating at 100 rpm to 500 rpm, and the developer film on the wafer W is replaced with the rinse liquid. After that, after the supply of the rinse liquid is stopped, the rotation speed of the wafer W is increased by driving the chuck driver 22, and the rinse liquid is shaken off from the wafer W to dry the wafer W. During drying, the rinse liquid supply 37 is retracted from the wafer W by driving the nozzle driver 38.

When the rinse liquid is supplied from the rinse liquid supply 37, the outer cup 103 is arranged at the second cup position. The effect of this configuration is as follows.

(C1) A desired airflow may be obtained around the side of the wafer W on the spin chuck 20.

(C2) The developer and the rinse liquid shaken off from the wafer W on the spin chuck 20 may be received by the annular wall 130 of the outer cup 103.

(C3) The mist generated by the supply of the rinse liquid may be sucked between the annular wall 130 and the inner cup 101.

Further, when the rinse liquid is supplied from the rinse liquid supply 37, the upper cover 104 is arranged at the second cover position. The effect of this configuration is as follows.

(D1) The rinse liquid bounced off from the wafer W may be received by the annular wall 140 of the upper cover 104.

The rinse liquid received by the annular wall 140 of the upper cover 104 falls on the upper surface of the annular wall 130 of the outer cup 103, reaches the inside of the intermediate cup 102 through the through hole 130b, and is discharged from the cup body 100 through the drain port 124.

Figure 6G:
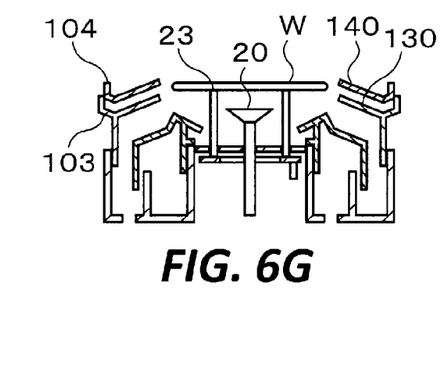

Subsequently, as illustrated in FIG. 6G, the elevating pin 23 is raised by driving the pin driver 24, and the wafer W is delivered onto the elevating pin 23.

Figure 6H:
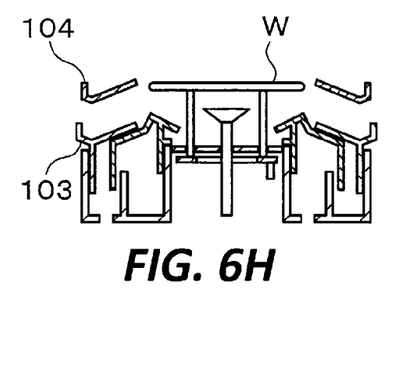

Next, by driving the elevating mechanism 151, the outer cup 103 is lowered and moved to the first cup position as illustrated in FIG. 6H.

Figure 6I:
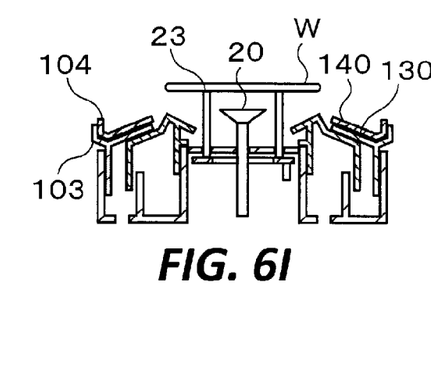

Subsequently, by driving the elevating mechanism 152, the upper cover 104 is lowered and moved to the first cover position as illustrated in FIG. 6I.

Then, the wafer W is delivered between the wafer transfer mechanism (not illustrated) inserted into the processing container 10 and the elevating pin 23 via the carry-in/carry-out port (not illustrated) provided on the side surface of the processing container 10. As a result, a series of development processes are completed, and a resist pattern is formed on the wafer W.

[When Developing with the Developer from the Second Developer Supply 40]

Figure 7A:
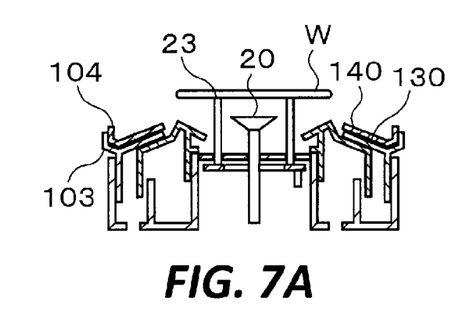
FIGS. 7A to 7I are diagrams illustrating an internal state of a development processing apparatus in each step of wafer processing when developing is performed with a developer from a second developer supply.

First, the wafer W is delivered from the wafer transfer mechanism (not illustrated) onto the elevating pin 23 in the same manner as in the case of developing with the developer from the first developer supply 34. Further, similar to the case of developing with the developer from the first developer supply 34, as illustrated in FIG. 7A, the outer cup 103 and the upper cover 104 are being moved to the first cup position and the first cover position, respectively, before the wafer W is delivered to the elevating pin 23.

Figure 7B:
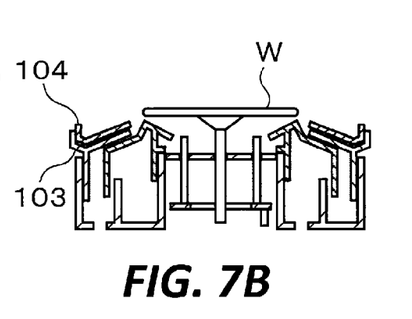

Next, by driving the pin driver 24, as illustrated in FIG. 7B, the elevating pin 23 is lowered, the wafer W is delivered to the upper surface of the spin chuck 20, and the wafer W is attracted and held by the spin chuck 20.

Figure 7C:
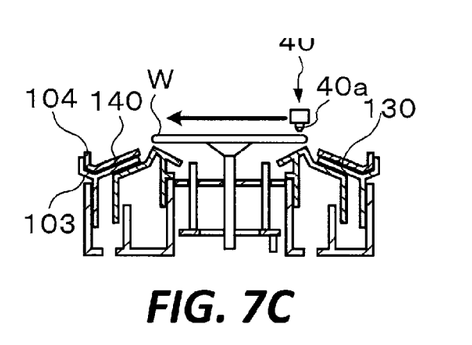

Subsequently, as illustrated in FIG. 7C, the second developer supply 40 is moved above the wafer W by driving the nozzle driver 35 in a state where the outer cup 103 and the upper cover 104 are arranged at the first cup position and the first cover position, respectively. Then, the developer is started to be supplied from the developer ejection nozzle 40a onto the wafer W, and the developer film is formed. For example, when forming the developer film, the second developer supply 40 is controlled by the nozzle driver 41 such that the ejection destination of the developer from the second developer supply 40 moves from one end to the other end of the peripheral edge of the wafer W. At this time, the wafer W is not rotating and is stationary. When the ejection destination of the developer from the second developer supply 40 reaches the other end of the wafer W and the developer film is formed, the supply of the developer from the developer ejection nozzle 40a is stopped, and the second developer supply 40 is retracted from the wafer W by driving the nozzle driver 41.

When the developer is supplied from the second developer supply 40, the outer cup 103 is arranged at the first cup position and the upper cover 104 is arranged at the first cover position. Therefore, in a case where the developer is supplied from the second developer supply 40, when the second developer supply 40 moves along the surface of the wafer W in a state of being close to the surface (e.g., the distance from the ejection port of the developer ejection nozzle 40a to the surface of the wafer W being 3 mm or less), the second developer supply 40 does not interfere with not only the outer cup 103 but also the upper cover 104. Further, when the second developer supply 40 moves between the standby portion 42 and the upper portion of the wafer W, the above-mentioned interference does not occur.

Figure 7D:
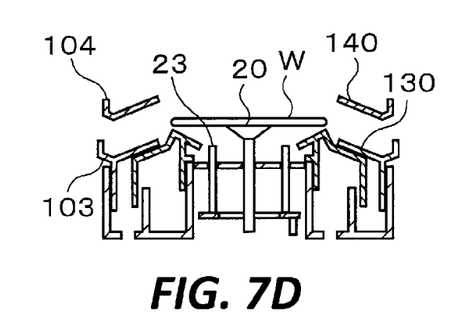
Figure 7E:
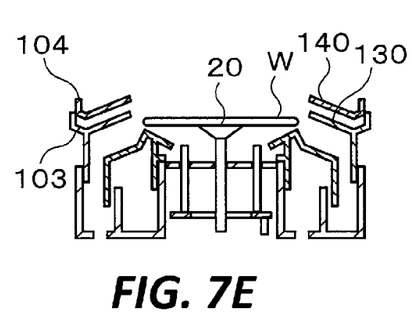

After the developer film is formed, while the resist film on the wafer W is being developed, as illustrated in FIG. 7D, the upper cover 104 is raised and moved to the second cover position by driving the elevating mechanism 152, and then, as illustrated in FIG. 7E, the outer cup 103 is raised and moved to the second cup position by driving the elevating mechanism 151.

Figure 7F:
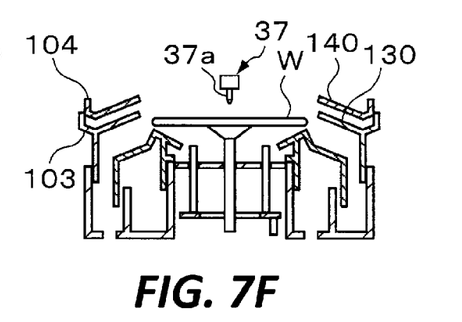

When a predetermined time elapses after the developer film is formed and the development of the resist film on the wafer W is completed, by driving the nozzle driver 38, the rinse liquid supply 37 moves above the center of the wafer W as illustrated in FIG. 7F, and the rinse liquid is supplied from the rinse liquid ejection nozzle 37a onto the wafer W to clean the wafer W. For example, at the time of this cleaning, replacement with a rinse liquid and drying of the wafer W are performed in the same manner as in the case of developing with the developer from the first developer supply 34.

In a case where developing with the developer from the second developer supply 40, when the rinse liquid is supplied, the upper cover 104 or the like is not arranged at a position corresponding to the second cover position of the related art. In contrast, in this example, the upper cover 104 is provided at the second position during the supply of the rinse liquid and the subsequent drying. Therefore, even when the rinse liquid bounces off from the wafer W when the rinse liquid is supplied, the rinse liquid may be received by the annular wall 140 of the upper cover 104. Thus, various methods may be adopted as a method for cleaning the wafer W using the rinse liquid, and the rotation speed of the wafer W and the flow rate of the rinse liquid may be increased when the rinse liquid is supplied.

Figure 7G:
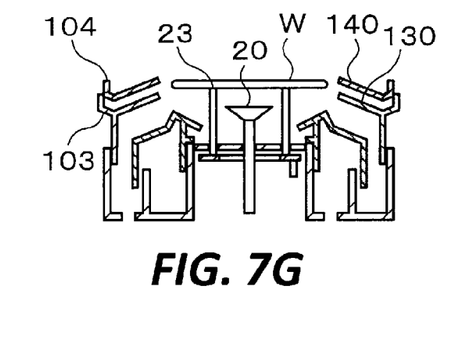

Subsequently, as illustrated in FIG. 7G, the elevating pin 23 is raised by driving the pin driver 24, and the wafer W is delivered onto the elevating pin 23.

Figure 7H:
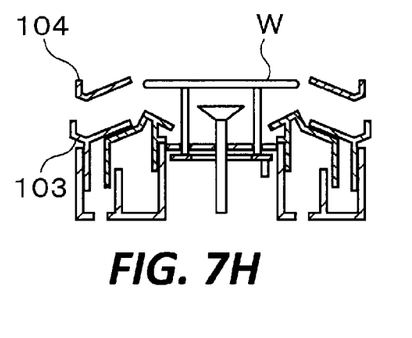

Next, by driving the elevating mechanism 151, the outer cup 103 is lowered and moved to the first cup position as illustrated in FIG. 7H.

Figure 7I:
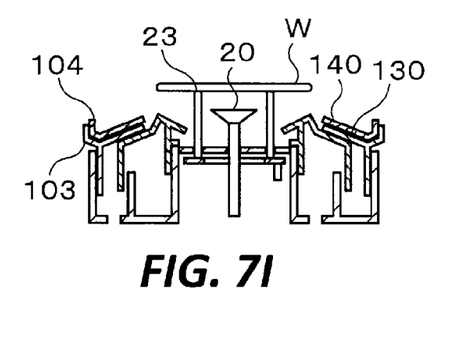

Subsequently, by driving the elevating mechanism 152, the upper cover 104 is lowered and moved to the first cover position as illustrated in FIG. 7I.

Then, the wafer W is delivered between the wafer transfer mechanism (not illustrated) inserted into the processing container 10 and the elevating pin 23 via the carry-in/carry-out port (not illustrated) provided on the side surface of the processing container 10. As a result, a series of development processes are completed, and a resist pattern is formed on the wafer W.

As described above, in the present embodiment, the development processing apparatus 1 includes a spin chuck 20 that holds the wafer W horizontally, a chuck driver 22 that rotates the spin chuck 20 around a vertical axis, first and second developer supplies 34 and 40 that supply the developer to the wafer W held by the spin chuck 20, and a cup body 100 that receives the developer from the wafer W held by the spin chuck 20. Further, in the present embodiment, in the plan view, the first developer supply 34 is formed to have a length smaller than the diameter of the wafer W in the plan view, and the second developer supply 40 is formed to have a length equal to or larger than the diameter of the wafer W. Further, in the present embodiment, the cup body 100 is formed in an annular shape having a circular opening having a diameter larger than the diameter of the wafer W in a plan view, and is configured to be able to move up and down with the annular walls 130 and 140. The outer cup 103 is provided above the upper cover 104, and the outer cup 103 and the upper cover 104 are configured to be able to move up and down independently of each other. That is, the annular wall 140 of the upper cover 104 is provided above the annular wall 130 of the outer cup 103, and the annular wall 130 and the annular wall 140 are configured to be able to move up and down independently of each other. As a result, the vertical distance between the annular wall 130 and the annular wall 140 is variable. Therefore, in the present embodiment, the following may be implemented.

(X1) When the developer is supplied from the second developer supply which is formed to be relatively long and may interfere with the annular walls 130 and 140, the annular walls 130 and 140 are arranged below the wafer W held by the spin chuck 20.

(X2) When the first developer supply 34, which is formed to be relatively short and may cause the developer to bounce off, is used, the annular wall 130 may be arranged above the wafer W held by the spin chuck 20. Further, in this case, the annular wall 140 may be arranged at a position above the annular wall 130 and at a position farther from the annular wall 130 than when the developer is supplied from the second developer supply 40.

Therefore, according to the present embodiment, in a plan view, the cup body 100 may be shared by the relatively long second developer supply 40 and the relatively short first developer supply 34 formed to have a length equal to or larger than the diameter of the wafer W.

Further, when the development processing apparatus 1 according to the present embodiment is mounted on the coating development system, the footprint of the coating development system may be reduced compared to the case where both the development processing device having only the relatively short first developer supply 34 and the development processing device having only the relatively long second developer supply are mounted.

In addition, in the present embodiment, the upper cover 104 and the outer cup 103 are elevated and lowered in a state where the wafer W is raised. Therefore, when the upper cover 104 and the outer cup 103 are elevated and lowered, the wafer W is not contaminated by the developer and the rinse liquid that have fallen from the upper cover 104 and the outer cup 103 due to vibration or the like. Further, the position where the wafer W stands by when the upper cover 104 and the outer cup 103 are elevated and lowered is at least a position where the surface of the wafer W is higher than the upper end of the annular wall 130 of the outer cup 103 at the second cup position, and more preferably, is a position where the surface of the wafer W is higher than the upper end of the annular wall 140 of the upper cover 104 at the second cover position.

In the above example, the relatively long second developer supply 40 moves horizontally along the surface of the wafer W when the developer is supplied. That is, the developer film is formed by scanning the second developer supply 40. However, when the second developer supply 40 is configured to be movable in the horizontal direction, the technique according to the present disclosure may be applied even when the second developer supply 40 is not scanned when forming the developer film.

Further, in the above example, when the developer is supplied from the relatively long second developer supply 40, the wafer W is not rotated but is stationary, but may be rotated.

The first developer supply 34 may have a size and an operating range that does not interfere with the upper cover 104 that has moved to the second cover position. In the above example, the first developer supply 34 also moves in the horizontal direction when forming the developer film, but the developer may be supplied from the first developer supply 34 in a fixed state to form a developer film. Further, in the above example, the number of the developer ejection nozzles 34a of the first developer supply 34 is plural, but may be one. In the above example, the developer ejection nozzle 34a is inclined to eject the developer obliquely with respect to the surface of the wafer W, but may be provided to eject the developer perpendicular to the surface of the wafer W.

In the above example, the timing of elevating and lowering the upper cover 104 and the outer cup 103 is different, such as elevating the upper cover 104 and then elevating the outer cup 103, but the upper cover 104 and the outer cup 103 may be raised and lowered at the same time.

According to the present disclosure, it is possible to provide a development processing apparatus and a development processing method capable of sharing a liquid receiver that receives a developer scattered from a substrate in the relatively long first developer supply and the relatively short second developer supply formed in a length equal to or larger than the diameter of the substrate in a plan view.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A development processing apparatus comprising:
a substrate holder configured to hold a substrate horizontally, the substrate including a resist film formed thereon;
a rotator configured to rotate the substrate holder around a vertical axis;
first and second developer supplies each configured to supply a developer to the substrate held by the substrate holder; and
a liquid receiver configured to receive the developer from the substrate held by the substrate holder,
wherein the first developer supply has a length smaller than a diameter of the substrate in a plan view,
the second developer supply has a length equal to or larger than the diameter of the substrate in a plan view,
the liquid receiver includes first and second annular walls each formed in an annular shape having a circular opening having a diameter larger than the diameter of the substrate in a plan view,
the second annular wall is provided above the first annular wall,
each of the first and second annular walls is configured to be movable up and down independently of each other, and
a vertical distance between the first annular wall and the second annular wall is variable.

2. The development processing apparatus according to claim 1, wherein when the developer is supplied from the second developer supply, the first annular wall and the second annular wall are located below the substrate held by the substrate holder, and
when the developer is supplied from the first developer supply, the first annular wall is located above the substrate held by the substrate holder, and the second annular wall is located above the first annular wall.

3. The development processing apparatus according to claim 1, wherein the vertical distance between the first annular wall and the second annular wall when the developer is supplied from the first developer supply is larger than when the developer is supplied from the second developer supply.

4. The development processing apparatus according to claim 1, wherein the first annular wall has a through hole that penetrates from an upper surface of the first annular wall to a lower surface of the first annular wall.

5. The development processing apparatus according to claim 1, wherein the second developer supply moves along a surface of the substrate held by the substrate holder when the developer is supplied.

6. The development processing apparatus according to claim 1, wherein a standby portion is provided outside the liquid receiver in a plan view, and
the first developer supply is located on the standby portion in a plan view when not in use.

7. The development processing apparatus according to claim 1, wherein the second developer supply moves on the substrate held by the substrate holder in a plan view when the developer is supplied from the second developer supply.

8. The development processing apparatus according to claim 1, wherein a lift is provided to move up and down the substrate, and
the first annular wall and the second annular wall are elevated and lowered in a state where the substrate is elevated by the lift.

9. A method for developing a resist film on a substrate using a development processing apparatus including:
a substrate holder configured to horizontally hold the substrate;
a rotator configured to rotate the substrate holder around a vertical axis;
first and second developer supplies each configured to supply a developer to the substrate held by the substrate holder; and
a liquid receiver configured to receive the developer from the substrate held by the substrate holder,
wherein the first developer supply has a length smaller than a diameter of the substrate in a plan view,
the second developer supply has a length equal to or larger than the diameter of the substrate in a plan view,
the liquid receiver includes first and second annular walls that are formed in an annular shape having a circular opening having a diameter larger than the diameter of the substrate in a plan view and are configured to be movable up and down, and
the second annular wall is provided above the first annular wall,
the method comprising:
supplying the developer from the second developer supply in a state where the first annular wall and the second annular wall are arranged below the substrate held by the substrate holder, and
supplying the developer from the first developer supply in a state where the first annular wall is arranged above the substrate held by the substrate holder and the second annular wall is arranged at a position farther from the first annular wall than when the developer is supplied from the first developer supply.

* * * * *